(12) United States Patent
Emma et al.

(10) Patent No.: US 7,483,325 B2
(45) Date of Patent: Jan. 27, 2009

(54) RETENTION-TIME CONTROL AND ERROR MANAGEMENT IN A CACHE SYSTEM COMPRISING DYNAMIC STORAGE

(75) Inventors: Philip G. Emma, Danbury, CT (US); William Roehr, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 11/688,455

(22) Filed: Mar. 20, 2007

(65) Prior Publication Data

US 2008/0235555 A1 Sep. 25, 2008

(51) Int. Cl.
*G11C 7/00* (2006.01)

(52) U.S. Cl. ...................................... 365/222; 365/201

(58) Field of Classification Search ................. 365/222, 365/201, 149; 711/154; 714/763
See application file for complete search history.

(56) References Cited

U.S. PATENT DOCUMENTS

| | | | |
|---|---|---|---|
| 6,542,793 B2 * | 4/2003 | Kojima et al. .................. 701/1 |
| 6,838,331 B2 | 1/2005 | Klein | |
| 6,965,537 B1 | 11/2005 | Klein et al. | |
| 7,171,605 B2 * | 1/2007 | White ......................... 714/763 |
| 2003/0147295 A1 | 8/2003 | Frankowsky et al. | |
| 2004/0117723 A1 | 6/2004 | Foss | |
| 2004/0243886 A1 | 12/2004 | Klein | |
| 2006/0044913 A1 | 3/2006 | Klein et al. | |
| 2006/0206768 A1 | 9/2006 | Varghese | |
| 2006/0206769 A1 | 9/2006 | Klein | |

* cited by examiner

*Primary Examiner*—Vu A Le
(74) *Attorney, Agent, or Firm*—Cantor Colburn LLP; Lisa M. Yamonaco

(57) ABSTRACT

Methods, systems, and apparatuses are provided for operating a cache comprising dynamic storage having an array of cells. At a refresh interval, the array of cells of the cache is refreshed. A determination is made whether an error is found in the cache at the refresh interval. If no error is found in the cache, the refresh interval is repeatedly increased by a predetermined amount until an error is found. If an error is found, the error is recovered from. A determination is made if a number of line deletions for the cache is a maximum number of line deletions for the cache. If the maximum number of line deletions is not attained, a line having the error is deleted, and the number of line deletions for the cache is increased. If the maximum number of line deletions for the cache is attained, the refresh interval is decreased by the predetermined amount.

19 Claims, 10 Drawing Sheets

RETENTION-TIME CONTROL AND ERROR MANAGEMENT IN A CACHE SYSTEM COMPRISING DYNAMIC STORAGE

BACKGROUND

Exemplary embodiments of this invention relate to dynamic storage, and particularly to dynamically and independently managing dynamic storage.

Substantially all modern computers and other digital systems rely on semiconductor memory devices to store data and instructions for processing by a central processing unit (CPU). Most of these systems have a system memory, which usually consists of dynamic random access memory ("DRAM") devices. The memory storage cost/bit of DRAM devices is relatively low because a DRAM memory cell needs relatively few circuit components to store a data bit as compared with other types of memory cells, such as static random access memory ("SRAM") devices. Thus, a high capacity system memory can be implemented using DRAM devices for a relatively low cost.

Although DRAM devices have the advantage of providing relatively low-cost data storage, they also have the disadvantage of consuming significant power. In fact, DRAM devices used in a digital system, such as a computer, can consume a significant percentage of the total power consumed by the system. The power consumed by computers and other digital systems can be a critical factor in their utility in certain applications.

One operation that tends to consume power at a substantial rate is refreshing memory cells in a DRAM device. As is well known in the art, DRAM memory cells, each of which essentially consists of a transistor (NFET) and a capacitor, must be periodically refreshed to retain data stored in the DRAM device. This refreshing is typically performed by activating each row of memory cells in an array, which essentially involves reading data bits from the memory cells in each row and then internally writing those same data bits back to the same cells in the row.

Refreshing is generally performed at a rate needed to keep charge stored in the memory cells that represents their logic state from leaking away between refreshes. Since refreshing involves accessing data bits in a large number of memory cells at a rapid rate, refreshing tends to be a particularly power-hungry operation. Thus, many attempts to reduce power consumption in DRAM devices have focused on reducing the rate at which power is consumed during a refresh operation. For example, a typical memory cell includes a transistor coupled to a storage element, typically a capacitor. Each memory cell stores a bit (i.e., a logic 1 or a logic 0) of the data. The memory cells are arranged in a matrix of addressable rows and columns, with each row corresponding to a multi-bit word of data. The bit of data in each memory cell is stored on the capacitor as charge, or lack thereof. This data must be refreshed because the charge of the capacitor leaks over time—the data retention time of the cell. In order to prevent the loss of data, the data stored in the memory cell must be refreshed before the end of the data retention time. It follows then that the faster the charge leaks from the memory cell, the higher the data refresh rate that is required for the cell.

The amount of power consumed by a refresh operation also depends on which of several refresh modes is active. A self-refresh mode is normally active during periods when data is not being read from or written to the DRAM device. Since many electronic devices, such as notebook computers, are often inactive for substantial periods of time, the amount of power consumed during a self-refresh operation can be an important factor in determining how long the electronic device can be used after a battery charge. While power is also consumed at a significant rate during other refresh modes when the DRAM device is active, the DRAM device is consuming power at a significant rate anyway while the data stored therein is being accessed. Therefore, if the power consumption during a self-refresh operation is reduced, the overall rate of power consumption is reduced.

One technique that has been used to reduce the amount of power consumed by refreshing DRAM memory cells is to vary the refresh rate as a function of temperature. As is well known in the art, the rate at which charge leaks from a DRAM memory cell increases with temperature. The refresh rate must be sufficiently high to ensure that no data is lost at the highest temperature in the specified range of operating temperatures of the DRAM device. Yet, DRAM devices normally operate at temperatures that are substantially lower than their maximum operating temperatures. Therefore, DRAM devices are generally refreshed at a rate that is higher than the rate actually needed to prevent data from being lost, and, in doing so, unnecessarily consume power. To address this problem, some commercially available DRAM devices allow the user to program a mode register to select a lower maximum operating temperature. The DRAM device then adjusts the refresh rate to correspond to the maximum operating temperature selected by the user. Although adjusting the refresh rate to correspond to a lower maximum operating temperature does reduce the rate of power consumed during a refresh operation, it nevertheless still allows power to be consumed at a significant rate. If the refresh rate was reduced beyond a safe limit, at least some of the memory cells might not be refreshed before that data stored therein was lost. Data subsequently read from the DRAM device would then contain erroneous data bits.

It should be understood, moreover, that the availability of the DRAM is impacted by the frequency of the refresh operation. When the DRAM is being refreshed, data can neither be retrieved from the macro nor written into the macro.

It is therefore desirable to have a method, system, and apparatus that reduces the power consumed by a DRAM device during a refresh of the DRAM and increases the DRAM availability.

SUMMARY

In accordance with one exemplary embodiment, a method of operating a cache system with dynamic storage having an array of cells is provided. The method includes refreshing, at a refresh interval, the array of cells of the cache by reading the cache and writing back to the cache and determining whether an error is found in the cache at the refresh interval. If no error is found in the cache, the refresh interval is repeatedly increased by a predetermined amount until the error is found in the cache. If the error is found in the cache, the error in the cache is recovered from. The method further comprises determining if a number of line deletions for the cache is a maximum number of line deletions for the cache. If the maximum number of line deletions for the cache is not attained, a line having the error is deleted from the cache, and the number of line deletions for the cache is increased. If the maximum number of line deletions for the cache is attained, the refresh interval for refreshing is decreased by the predetermined amount.

In accordance with another exemplary embodiment, a cache system is provided which includes a dynamic storage device having an array of memory cells arranged in rows and columns. An error correction unit for determining and correcting an error found in the array of memory cells of the dynamic storage device, and a refresh unit configured to manipulate a refresh interval of the array of memory cells in the dynamic storage device. If no error is found, the refresh unit is configured to increase the refresh interval by a predetermined amount until the error is found in the dynamic storage device. If an error is found, the error correction unit is configured to correct the error in the dynamic storage device, and the refresh unit is configured to delete a line having the error until a number of line deletions for the dynamic storage device is a maximum number of line deletions for the dynamic storage device. The refresh unit is further configured to reduce the refresh interval by the predetermined amount.

In accordance with another exemplary embodiment, a refresh unit is provided for controlling operations of an array of memory cells. In this exemplary embodiment, the refresh unit includes a refresh interval module configured to manipulate the refresh interval of the array of memory cells, and an error correction module. The refresh interval module repeatedly increases the refresh interval by a predetermined amount until an error is found. The error correction module corrects the error, if the error is found. If a number of line deletions of the array is not a maximum number of line deletions of the array, the refresh interval module is configured to delete a line having the error, increase the refresh interval by the predetermined amount, and increase the number of line deletions of the array. If the error is found and if the number of line deletions of the array is the maximum number of line deletions of the array, the error correction module corrects the error, and the refresh interval module reduces the refresh interval by the predetermined amount.

Additional features are realized through the techniques of the present disclosure. Other embodiments of the invention are described in detail herein and are considered a part of the claimed invention. For a better understanding of features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features are apparent from the following detailed description taken in conjunction with the accompanying drawings in which:

The detailed description explains exemplary embodiments, together with features, by way of example with reference to the drawings.

DETAILED DESCRIPTION OF EXEMPLARY EMBODIMENTS

Figure 1:
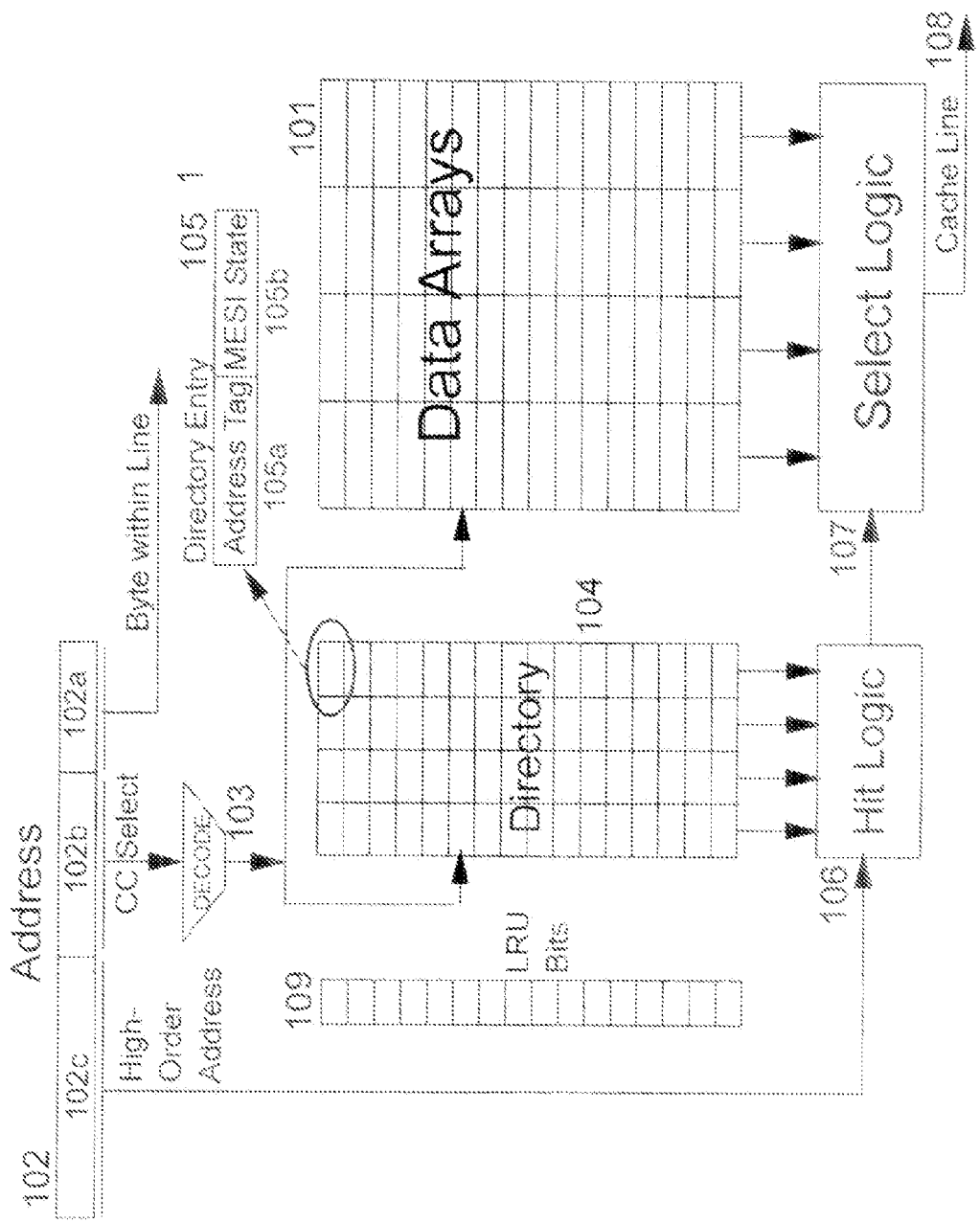
FIG. 1 illustrates a non-limiting example of an implementation of a cache.

Turning now to the drawings in greater detail, FIG. 1 illustrates a non-limiting example of an implementation of a cache. The cache may be envisioned as being the data arrays 101, in which data is being stored. In addition to the data arrays 101, FIG. 1 shows other hardware to place and administer that data. Data is stored in a cache in a granularity called a "cache line," also called a "cache block." Cache lines are fixed quanta for any machine and range from 32 bytes to 256 bytes in most computers. Lines are stored on line boundaries. That is, if the line size is 128 bytes, then the line begins on 128 byte boundaries. Thus, each little tile in the data arrays 101 of FIG. 1 represents a cache line.

The data arrays 101 are shown as having 4 columns (in this non-limiting example) and a large number of rows. This represents a 4-way set-associative cache, the operation of which is explained in detail below. Lines in a cache correspond to addresses 102. Addresses generated by the computer may be byte-addresses (i.e., they specify a particular byte), which are much more specific than the line address used by the cache. Therefore, an address 102 may be visualized as being divided into three parts. The "Byte Within Line" 102a are the bits of the address that are below the granularity of a line. For example, if the line size were 128 bytes, the low order 7 bits would specify the Byte Within Line 102a. These bits are not used in fetching a cache line. They are used subsequently to choose the appropriate byte or word from the line (not shown).

The next set of bits in the address 102 is the "Congruence Class Select Bits" 102b. The number of bits in this division is the $\log_2$ of the number of congruence classes. The decoder 103 decodes these bits, and a specific row is selected from both the data arrays 101 and the corresponding directory 104. Since this is a 4-way set-associative cache, each of the four sets of the selected congruence classes are read out of the directory 104 and the data array 101. There is a 1-to-1 correspondence between the directory entries and the lines of the data array 101. With regard to nomenclature, those skilled in the art may sometimes identify a congruence class as a "set," and those skilled in the art may separate a "set" into "ways."

A directory entry 105 is shown as a breakout in FIG. 1. The directory entry 105 contains an address tag 105a, and a "Modified, Exclusive, Shared, or Invalid" (MESI) state 105b. The address tag 105a simply contains the high-order address bits of the cache line that are stored in the corresponding location. The hit logic 106 compares the High Order Address Bits 102c of the address 102 to the address tags 105a of each of the four directory entries 105 of the selected congruence class to determine whether any of the address tags 105a match the address 102 being requested. The MESI state 105b contains information about the state of the corresponding cache line. The most basic information in the MESI state 105b is whether the line is valid, or whether the location is invalid (empty). There is other information in the MESI state 105b that is used for maintaining cache coherence, which is not relevant to the present disclosure.

If the hit logic 106 finds an address tag 105a that matches the High Order Address Bits 102c, and the corresponding MESI state 105b indicates that the entry is valid, then this is a cache "hit." The number of the set that the hit is located in is then sent to the selection logic 107 to gate out the selected cache line 108.

Every subsection (e.g., congruence class) has a set of LRU Bits 109 associated with it. The LRU Bits 109 specify the historical use-ordering of the lines held within the subsection. The LRU Bit 109 state is used for replacement decisions. Specifically, if a new line is referenced and brought into the cache, it must displace one of the lines that is already stored there. Generally, it displaces the line that was the Least Recently Used (LRU). Although FIG. 1 illustrates the general structure of a 4-way set-associative cache, the present disclosure is not restricted to any one particular type of cache and may be applied to any type of dynamic storage.

As discussed above, the cells in a DRAM array comprise two populations. There is a small population of "bad" cells that lose their state more rapidly, primarily due to sub-threshold leakage, junction leakage, and/or oxide leakage. Because the discharge events are thermally activated, and device parameters vary widely from one device to the next (e.g., threshold fluctuations), the distribution of retention times has a large standard deviation. The second population is the overwhelming majority of "good" cells, which deplete their charge very slowly and primarily through their attached access device (transistor) in accordance with the device threshold, until they are no longer interpreted as holding a "1" state. Both effects are exacerbated by heat. In accordance with the situation discussed above, FIG. 2 illustrates a non-limiting example of probability distribution functions of the discharge times of two different populations of DRAM cells.

Figure 2:
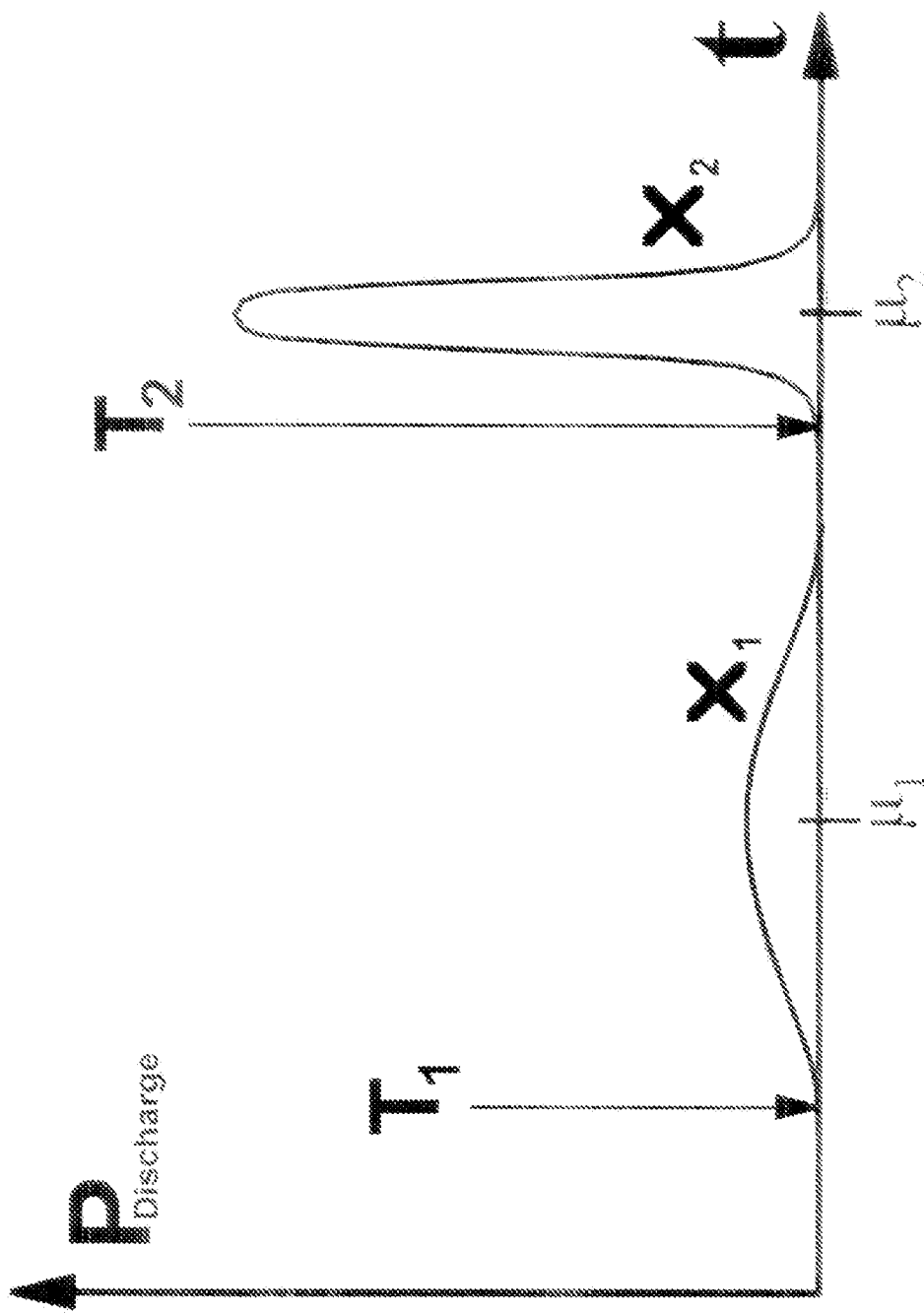
FIG. 2 illustrates a non-limiting example of probability distribution functions for DRAM cells.

As depicted in FIG. 2, there is a small population of "bad" cells normally distributed around $\mu_1$, which lose their charge early, and a large population of "good" cells normally distributed around $\mu_2$, which hold their charge much longer (this graph is for illustrative purposes and is not to scale).

Since "retention time" is defined statistically as being a "safe" number of standard deviations below the time at which the first cell in a large population of cells (which certainly includes a few of the "bad" cells) loses its charge, the retention time is necessarily dictated by the distribution of "bad" cells centered around $\mu_1$. Accordingly, a memory chip should then have a safe "refresh interval" prescribed which accommodates the retention time of the worst cell in the population of bad cells. This is shown in FIG. 2 as T1.

In a cache, in which Error Correcting Codes (ECC) are maintained on a smaller granularity, e.g., on a word or double-word basis, the statistics are very different. Statistically, there will be a small population of words in the entire cache having a single "bad" cell, and therefore, the "population" of concern may be a few tens of bits.

Additionally, because of the correction capability of ECC, the cache may tolerate a single error in any word. The event to protect against typically is getting two (or more) errors in a word. Therefore, the appropriate "refresh interval" in an ECC-protected cache is determined by the distribution of "good" cells, for example centered around $\mu_2$. This refresh interval is shown in FIG. 2 as "T2." Since T2 can be many times larger than T1, the frequency of refresh may be greatly reduced. Accordingly, power is saved, and the interference with running programs caused by refresh is greatly reduced.

Therefore, exemplary embodiments demonstrate implementations to set the refresh interval as close as possible to T2 by having the refresh circuitry (or refresh unit 1010 in FIG. 10) "learn" where T2 is, and to subsequently adapt itself as the temperature fluctuates. Further, what was learned is saved in other media or memory, so that the learned information of the cache may be set appropriately on subsequent use.

In addition to retention errors occurring because of charge decay, there are also occasional soft errors caused by cosmic events in which particles from the sun and/or alpha particles emitted from lead-based solders induce soft errors. That is, even if the capacitors did not leak at all, there is a very occasional event in which an extraneous particle having the right energy can hit the cell and deplete the charge all at once. These cosmic events do not cause any permanent damage (which is why the errors are called "soft"), but they will cause an error. Also, there are hard errors that eventually happen as devices age and wear out.

From a systems-reliability point of view, it is not a viable solution to continue using a word having a single "bad" cell (and to repeatedly cause single-bit errors) with a large refresh interval (e.g., T2) just because it is recoverable with a "Single Error Correcting, Double Error Detecting" (SECDED) ECC. SECDED codes are usually used in servers to correct any single error, and to detect (but not correct) two errors. If a cosmic event also causes a soft error elsewhere in the word or if another cell within the word exhibits a retention problem, then there are two errors, which will not be recoverable.

Figure 3:
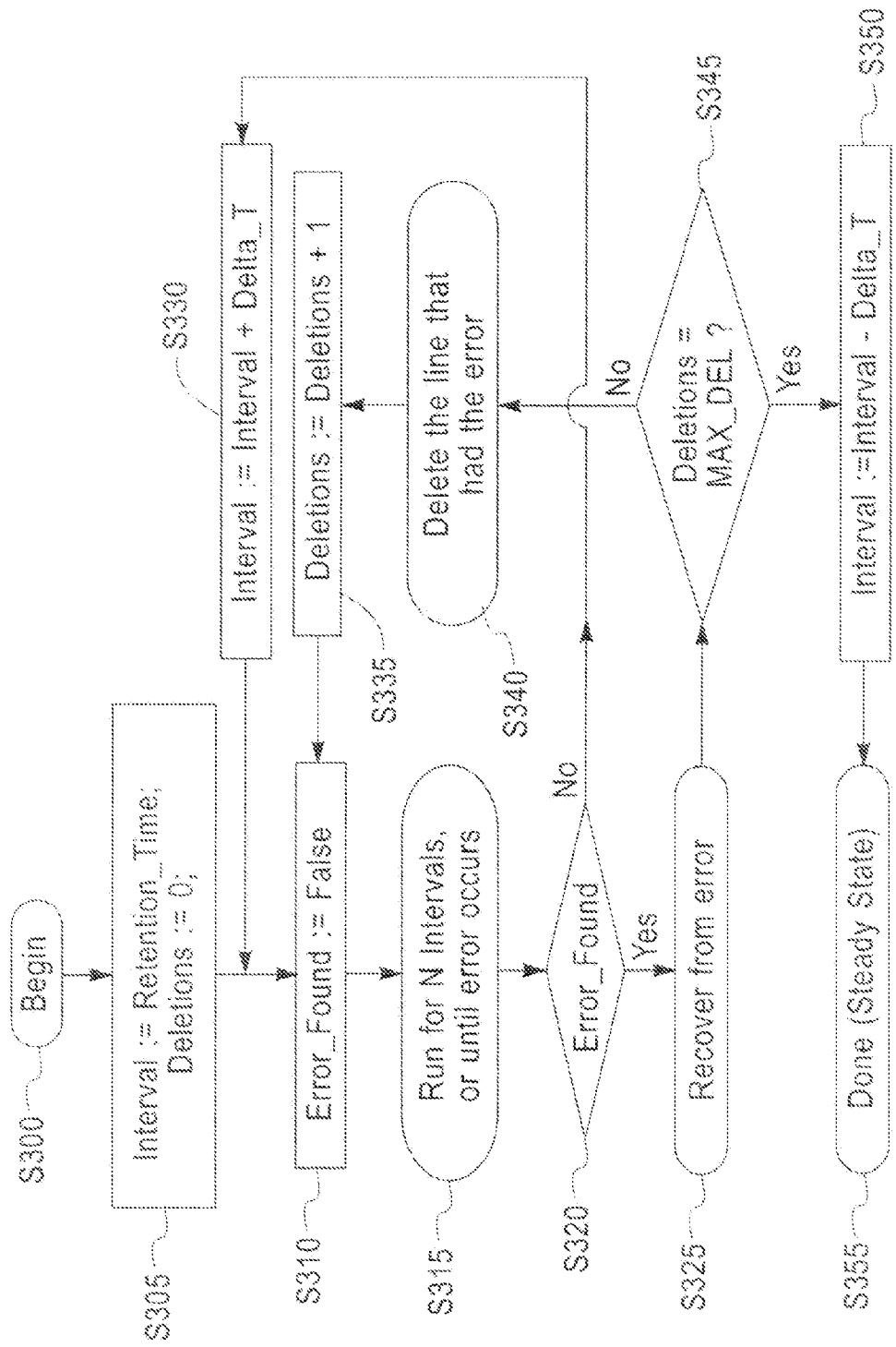
FIG. 3 illustrates a non-limiting example of an adaptation process according to one embodiment.

FIG. 3 illustrates a non-limiting example of an adaptation process by which the retention interval is regressed into steady state with a fixed number of cache line deletions. This exemplary embodiment depicts a process of filtering out the bad population of cells utilizing a line delete capability. This makes it possible to "delete" physical lines from the cache, which is accomplished by annotating (in one of many possible ways) the physical line locations that are not to be used. The replacement algorithm is augmented to make sure that it never puts lines (data) into these locations. The process in FIG. 3 affords the cache (or each congruence class, subsection, etc.) the ability to delete a predetermined number of cache lines.

In FIG. 3, once the adaptation process starts (S300), the refresh interval is set to a nominal retention time, with no deletions made in the cache (S305). The error flag is turned off (S310), and an attempt to run for N refresh intervals is performed (S315). If no error occurs in N intervals (S320), the refresh interval is increased by Delta_T (S330). But if an error occurs (S320), the error is recovered from (S325), and a determination is made whether Deletions equals MAX_DEL deletions (S345). If Deletions does not equal MAX_DEL deletions, the line that had the error is deleted (S340). Deletions are increased by 1 (S335), the error flag is turned off (S310), and the process attempts to run for N more intervals or until an error occurs (S315). If the cache has deleted MAX_DEL lines (S345) such that Deletions equals MAX_DEL, the refresh interval is shortened by a safety margin Delta_T (S350). Thus, the adaptation process (which may be executed by, for example, the refresh unit 1010 in FIG. 10) has learned the Steady State (S355).

Figure 6:
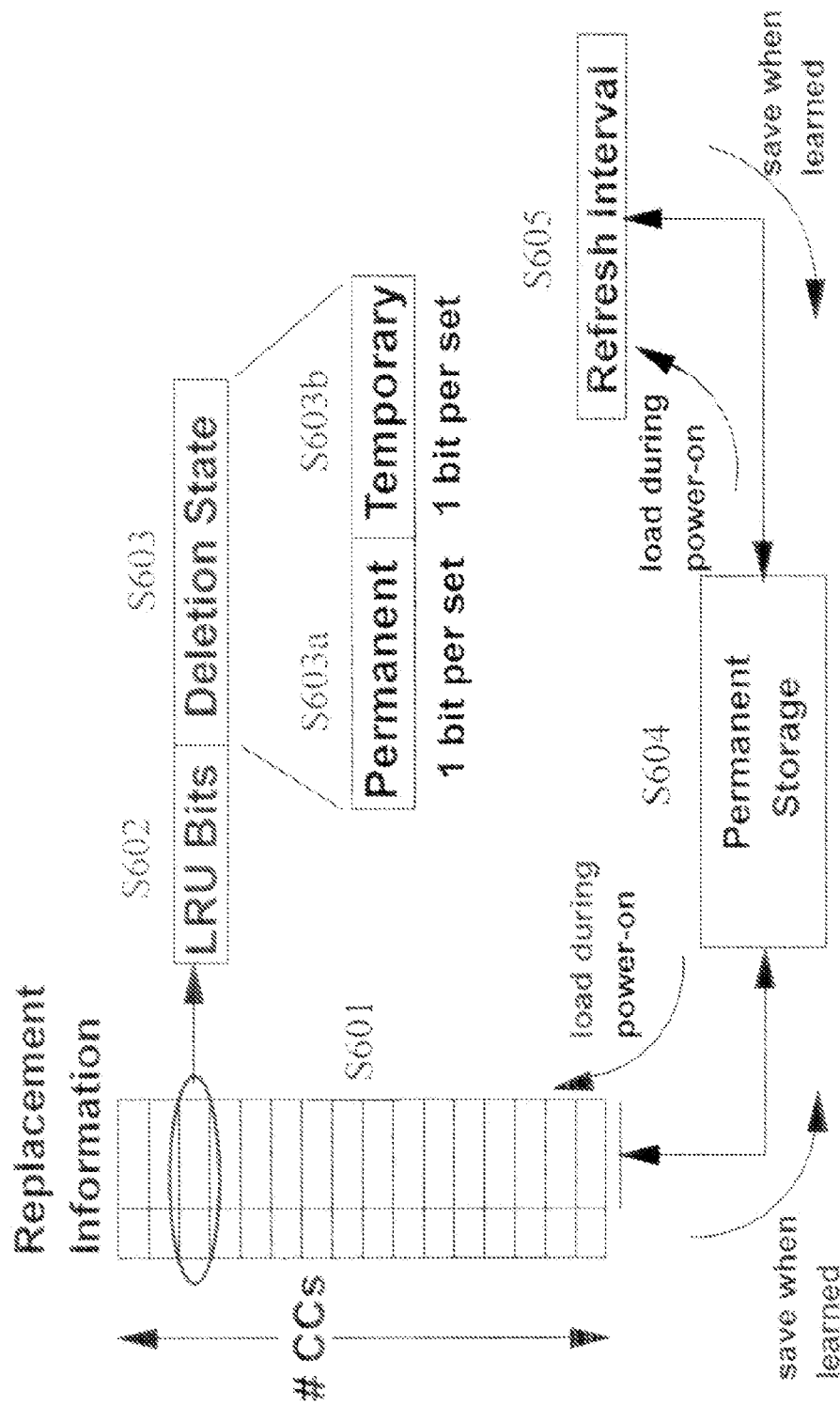
FIG. 6 illustrates a non-limiting example of a deletion state appended to the LRU Bits, and illustrates the learned state being saved in permanent storage.

Also, the adaptation process may be instructed to re-learn the steady state after fluctuations in the temperature, at specific times, and/or after certain designated events occur. The history of the information learned during the adaptation process may be stored in nonvolatile memory and used in a subsequent learning process (FIG. 6). The refresh interval may be increased by a predetermined amount which is set in advance.

Figure 4:
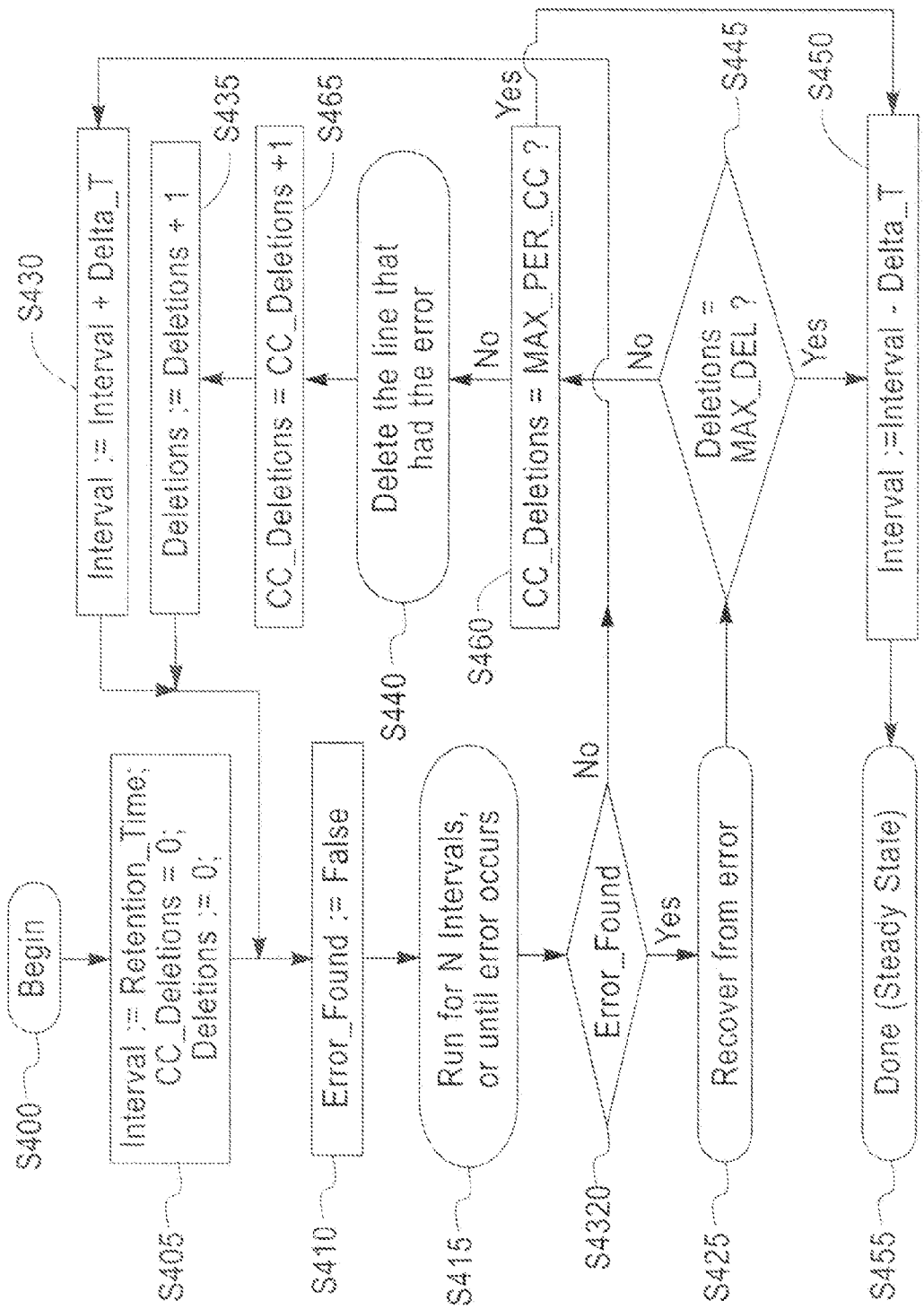
FIG. 4 illustrates a non-limiting example of an adaptation process for individual subsections of a cache.

FIG. 4 illustrates a non-limiting example of an adaptation process for individual subsections of the cache by which the retention interval is regressed into steady state with a fixed number of cache line deletions for each subsection. The adaptation process in FIG. 4 is similar to the adaptation process discussed in FIG. 3. However, FIG. 4 depicts operations for determining the steady state for individual subsections of the cache, which include the operation of determining whether the limits MAX_PER_CC of a subsection of the cache are exceeded (S460). Although the subsection is identified as a congruence class in this non-limiting example, the cache may be partitioned into any desired subsection and is not limited to congruence classes.

In FIG. 4, once the adaptation process starts (S400), the refresh interval is set to a nominal retention time for a congruence class, with no deletions being made in the congruence class (S405). The error flag is turned off (S410), and an attempt to run for N refresh intervals is performed (S415). If no error occurs in N intervals (S420), the refresh interval is increased by Delta_T for the congruence class (S430). But if an error occurs (S420), the congruence class recovers from the error (S425) and then determines whether Deletions equals MAX_DEL deletions (S445). Unlike the adaptation process in FIG. 3, if Deletions does not equal MAX_DEL deletions, the process determines whether CC_Deletions equals MAX_PER_CC (S460). If CC_Deletions does not equal MAX_PER_CC (S460), the process deletes the line that had the error (S440), increases CC_Deletions by 1 (S465), increases Deletions by 1 (S435), sets the error flag to off (S410), and attempts to run for N more intervals (S415).

If the cache has deleted MAX_DEL lines (S445) such that Deletions equals MAX_DEL, the refresh interval is shortened by a safety margin Delta_T (S450), and the adaptation process has found Steady State for the congruence class (S455). Likewise, if CC_Deletions equals MAX_PER_CC lines (S465), the retention time is shortened by a safety margin Delta_T (S450). Thus, the adaptation process (executed by, e.g., the Refresh Unit 1010 in FIG. 10) has found Steady State for the congruence class (S455). The operations of the adaptation process may be performed for each subsection, for example congruence class, or any desired division of the cache.

The numbers MAX_PER_CC and MAX_DEL may be determined in general from a statistical analysis of the density functions of the cell populations, together with an analysis of how much performance is lost by deleting various numbers of lines from any congruence class, or from the cache in general. In accordance with a desired performance requirement of the cache and/or a particular application, the numbers MAX_PER_CC and MAX_DEL may be determined. Additionally, the numbers MAX_PER_CC and MAX_DEL may be determined specifically for any particular chip by measuring the decays of the memory cells directly in a prolonged test sequence.

Figure 5:
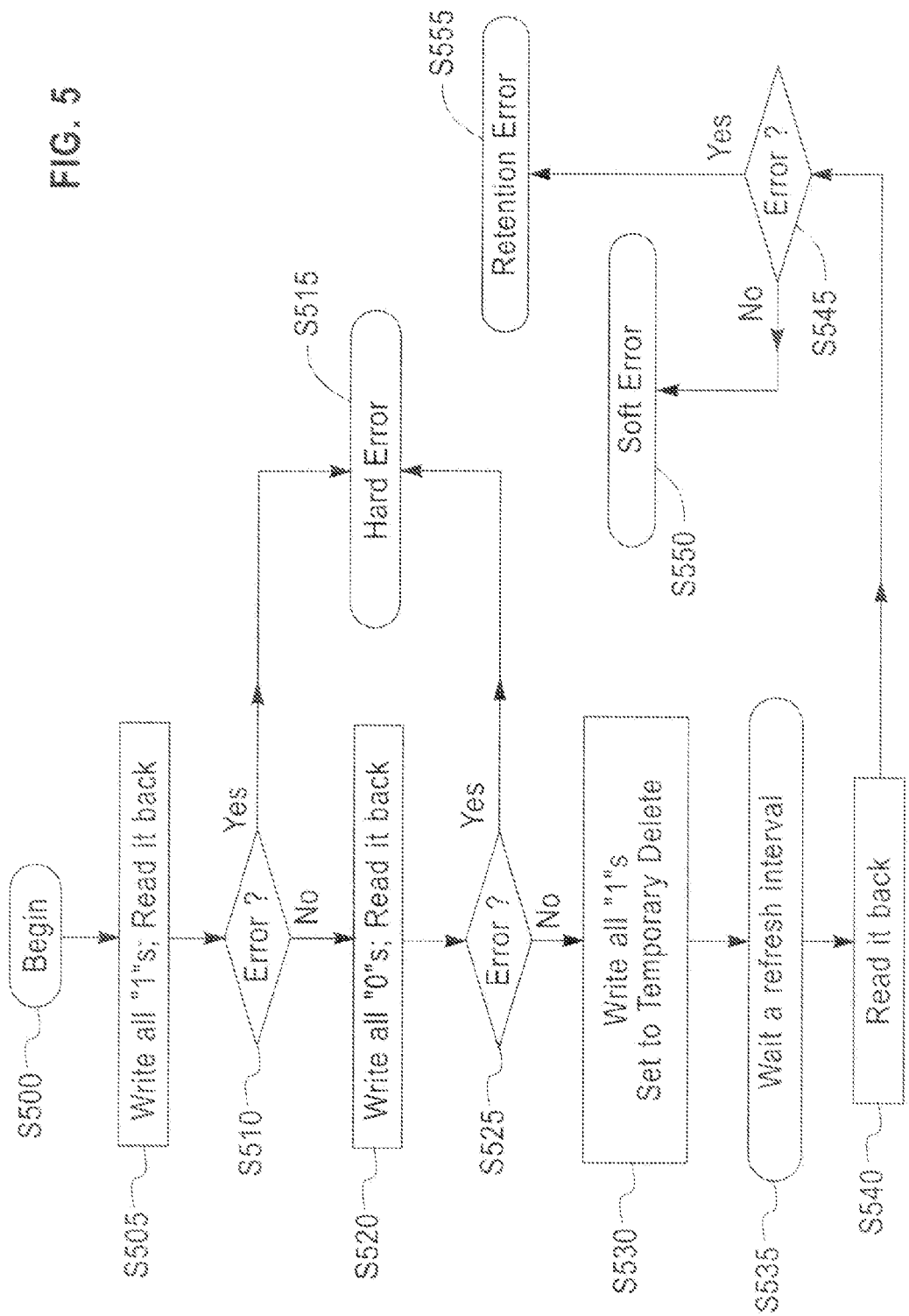
FIG. 5 illustrates a non-limiting example of a process for distinguishing a type of error.

When an error is found, for example in FIGS. 3 and 4, it is important to identify the type of error so that the appropriate deletion is performed. FIG. 5 illustrates a non-limiting example of a process for distinguishing the type of error. The operations of FIG. 5 begin (S500) by writing all "1"s and reading the "1"s back (S505). If an error occurs (S510), the error is a hard error (S515). If no error occurs (S510), the operation writes all "0"s and reads the "0"s back (S520). If an error occurs (S525), the error is a hard error (S515).

However, if no error occurs (S510 and S525), the operation writes all "1"s and isolates the line by temporarily deleting it (S530), which ensures that no intervening references are made to the line (which would refresh the state thereof). After waiting a refresh interval (S535), the line is read back (S540), and if any bit has lost its state (S545), it is determined that the prior error (which initiated this test sequence) was a retention error (S555). If all of the bits are still good after the refresh interval (S545), it is determined that the prior error was a soft error (S550).

Further, because there is a degree of nuance in identifying a retention error, it is contemplated that a modified version of FIG. 5 may exploit nonvolatile memory holding previous retention time, ambient temperature, and error count content to make an error classification. Also, bit error history may be stored in a nonvolatile memory and may be updated over time as appropriate (FIG. 6).

Since the type of error is identified as being a hard error, a retention error, or a soft error, this information is used to determine the type of deletion applied to the line. For hard errors, a permanent deletion may be performed. For retention errors (or refresh errors) a temporary deletion may be performed to allow for further adaptation. For soft errors, there is no deletion, because these do not recur in any predictable way. Nevertheless, for any type of error, the error must be recovered from, and then the error is identified so that the appropriate deletion may or may not be performed.

Further, if a line has been deleted because of an error, the line may be used again if the refresh interval of the cache is shortened. For example, the line may have an error when the refresh interval is increased beyond a certain point, but otherwise the line has no physical problems (hard errors). If this line has been deleted, it may be reenlisted (for writing and reading to) when the refresh interval of the cache is shortened. By reducing the refresh interval, the previously deleted line may be refreshed at a rate sufficient to prevent an error from occurring.

As discussed herein, exemplary embodiments of the adaptation process learn the refresh interval and manage the cache accordingly. The adaptation process is capable of dynamically accommodating the changing parameters and environment of the cache.

Representing and Permanently Storing Deletion States

The deletion state of a line may be stored as part of its MESI state. That is, in addition to the states "Modifies, Exclusive, Shared, Invalid," and all of the variations of those states, the states "Permanently Deleted" and "Temporarily Deleted" may be added. However, it may be better to append the deletion states of the lines within a congruence class to the LRU Bits (109 in FIG. 1) for that congruence class.

Appending the deletion states to the LRU Bits is beneficial for two reasons. First, since the replacement algorithm needs to know the LRU State as well as the deletion states of the lines within a congruence class to make a replacement decision (and specifically, to never allocate data to a deleted line), it is convenient to put all of this information in the same place. Second, once the deletion states have been "learned" (i.e., once Steady State has been reached) for a particular cache or congruence class, that learned information is stored permanently so that the learned information is loaded into the cache directory whenever the machine is powered on. The deletion states that are permanently stored need to be appropriate for some nominal operation temperature (it is explained below how the learned information adapts with thermal drift). The adaptation process dynamically accommodates the changing parameters and environment of the cache.

FIG. 6 illustrates a non-limiting example of the deletion state appended to the LRU Bits and illustrates the learned state being saved in permanent storage. The replacement information 601 includes both the LRU Bits 602 (shown in FIG. 1 as 109) and the deletion state 603. The deletion state 603 includes both permanent deletions 603a and temporary deletions 603b. Since each line may be deleted either permanently or temporarily, the encoding is "direct," such that there is 1 bit per set for each type of deletion. Numerous other encodings are possible for indicating if the line is deleted permanently or temporarily, and the encoding of the deletion state is not intended to be limited.

Moreover, the deletion state 603 is learned in conjunction with the refresh interval 605, which was modulated in the learning process discussed in FIGS. 3 and 4. Specifically, the learned deletion state 603 is meaningful only to this particular refresh interval 605, which was modulated to obtain it. Thus, in the remainder of this discussion, when saving and restoring the deletion State 603 is referred to, this also implicitly means saving and restoring the refresh interval 605.

Another new element in FIG. 6 is the permanent storage 604. Once the deletion state 603 has been learned, it should be saved into permanent storage 604, where it can be reloaded on any power-on (or at any other time) so that it need not be relearned. There are three basic variations on what the permanent storage 604 technology is, and two basic variations on when the deletion state 603 is first established.

First, permanent storage 604, for example, may be main memory, which is eventually written to magnetic storage or disk. If the deletion state is made visible to some part of the Instruction Set Architecture (ISA) (perhaps at the millicode level), then once steady state has been reached, the refresh hardware (software, or combination thereof) can generate an interrupt to the processor, and the millicode can transfer the learned state to a special area of the memory. On a power-up, millicode can fetch the data from the memory (or disk) and load it back into the cache directory.

If the deletion state is not made visible to the ISA, then the refresh hardware may signal a service processor when it has learned the deletion state, and the deletion state may be read out by the service processor (usually via a serial scan).

Second, permanent storage 604 may include nonvolatile storage elements, which may be on-chip or off chip. Since there are not many bits, transferring and storing the deletion state on chip (in a special nonvolatile array) may be done. This state may be encoded more densely and be compressed, if the amount of storage is an issue. The working copy of the deletion state should be dynamically modifiable, since the nominal deletion state may have to adapt with changes in temperature (discussed below). The permanent storage 604, however, need not be modifiable, as any type of nonvolatile storage is sufficient.

Third, since the above is true, if the deletion state (or a compressed version thereof) is small enough, the permanent storage 604 may include on-chip fuses.

Now, regarding the two basic variations on when the deletion state is first learned, exemplary embodiments above disclose the learning process as if it were being executed in a system running in a real environment. This is one of the intended variations. However, the deletion state that should be stored should reflect a "nominal" operating point (temperature). Therefore, when this state is learned in a real running environment, the "Steady State" point should be established within a known temperature range. Most computers now have on-chip thermometers and other ways of determining the temperature.

The second environment in which the deletion state may be learned is on a tester when the chip is manufactured. In this environment, the temperature can be carefully controlled. Since each chip is different, the deletion state and retention interval may be established and stored in an appropriate way for each chip. For deletion state data that is to be stored in memory (or on a disk), the data can be shipped in a file along with the chip. For deletion state data that is to be stored in nonvolatile on-chip storage or in on-chip fuses, this data may be written immediately, while the chip is still in the tester.

Adapting the Retention Interval as Temperature Drifts

Up to this point, the notion of a "Steady State" has been discussed, which is the state reached when a prescribed number of deletions have been performed in accordance with regressing a refresh interval. Consequently, the Steady State results in a greatly relaxed refresh interval, with a minimal performance impact due to the lines lost. The rate of retention (refresh) errors is temperature dependent. Steady State was first presented under the implicit assumption that the temperature is constant. Previously, temperature dependence has been mentioned, and it was prescribed that the deletion state and refresh interval that are to be written into permanent storage should be "learned" at a known and nominal temperature.

In this section, it is further explained how to adapt the retention interval as the temperature changes. As a machine runs, the temperature can get cooler, remain the same, or get warmer. If the temperature gets cooler, then the rate of retention errors will decrease, which means that the refresh interval can be regressed (lengthened) even further. If the temperature remains constant, there should not be any new retention errors, and errors that occur should mostly be soft errors. Conversely, if the temperature gets warmer, the refresh interval will need to be shortened to prevent the occurrence of any new retention errors.

Figure 7:
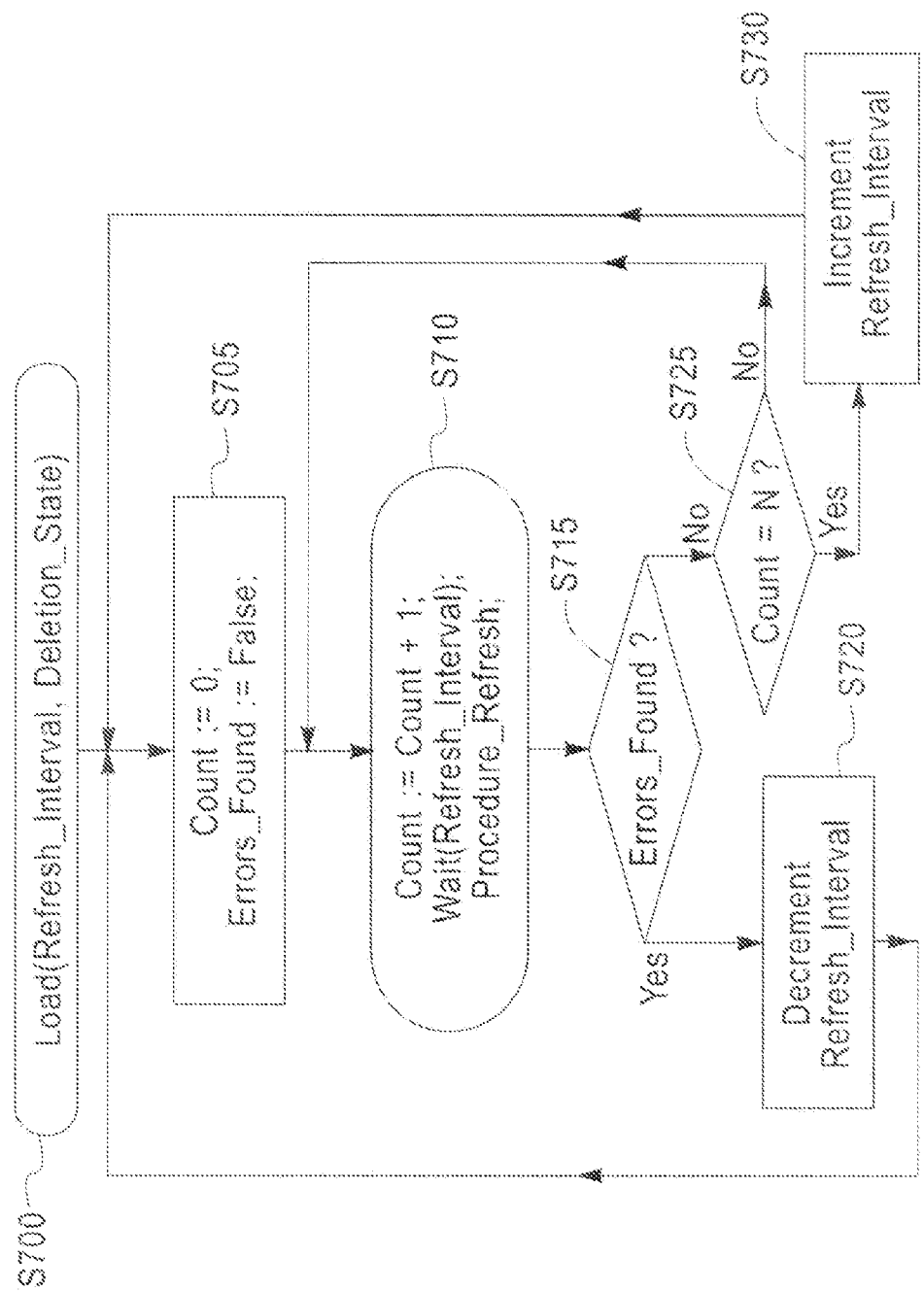
FIG. 7 illustrates a non-limiting example of an adaptation process according to one embodiment.

FIG. 7 illustrates a non-limiting example of an adaptation process. When the machine is powered-on, the refresh interval and deletion state are loaded (S700), which were determined during a previous adaptation process. In FIG. 7, it is assumed that the temperature may cool down within N refresh intervals. The variable "Count" is used to count the number of refresh intervals that have passed without finding a retention error. Initially, the Count is set to 0 and the error flag is turned off (S705). On each cycle through the adaptation process the Count is incremented, a refresh interval passes, and the refresh procedure is run (S710). If any retention errors are found (S715), the refresh interval is shortened by a predetermined amount (S720), and the Count starts over (S705). If no retention errors are found (S715), and the Count does not equal N (S725), the Count is increased by 1, and the procedure is run after refresh (S710). If no retention errors are generated in N cycles through of the adaptation process (S725), the refresh interval is increased (lengthened) (S730).

In FIG. 7, it is assumed that the system (or machine, etc.) is heating up if retention errors are encountered. If no retention errors occur, however, there is no way of knowing whether the system is cooling down. This is a "proactive" process. After every N refresh intervals in which no errors are encountered (S725), an attempt is made to regress (lengthen) the refresh interval (S730) on the assumption that the system has cooled down. If the system has not cooled down, however, it is probable that an error is caused as the process attempts to increase the refresh interval. Having errors causes the process to restore the refresh interval to its original state, and continue learning. In the mean time, if the system heats up, the errors that are caused makes the process shorten the refresh interval until the errors stop.

Figure 8:
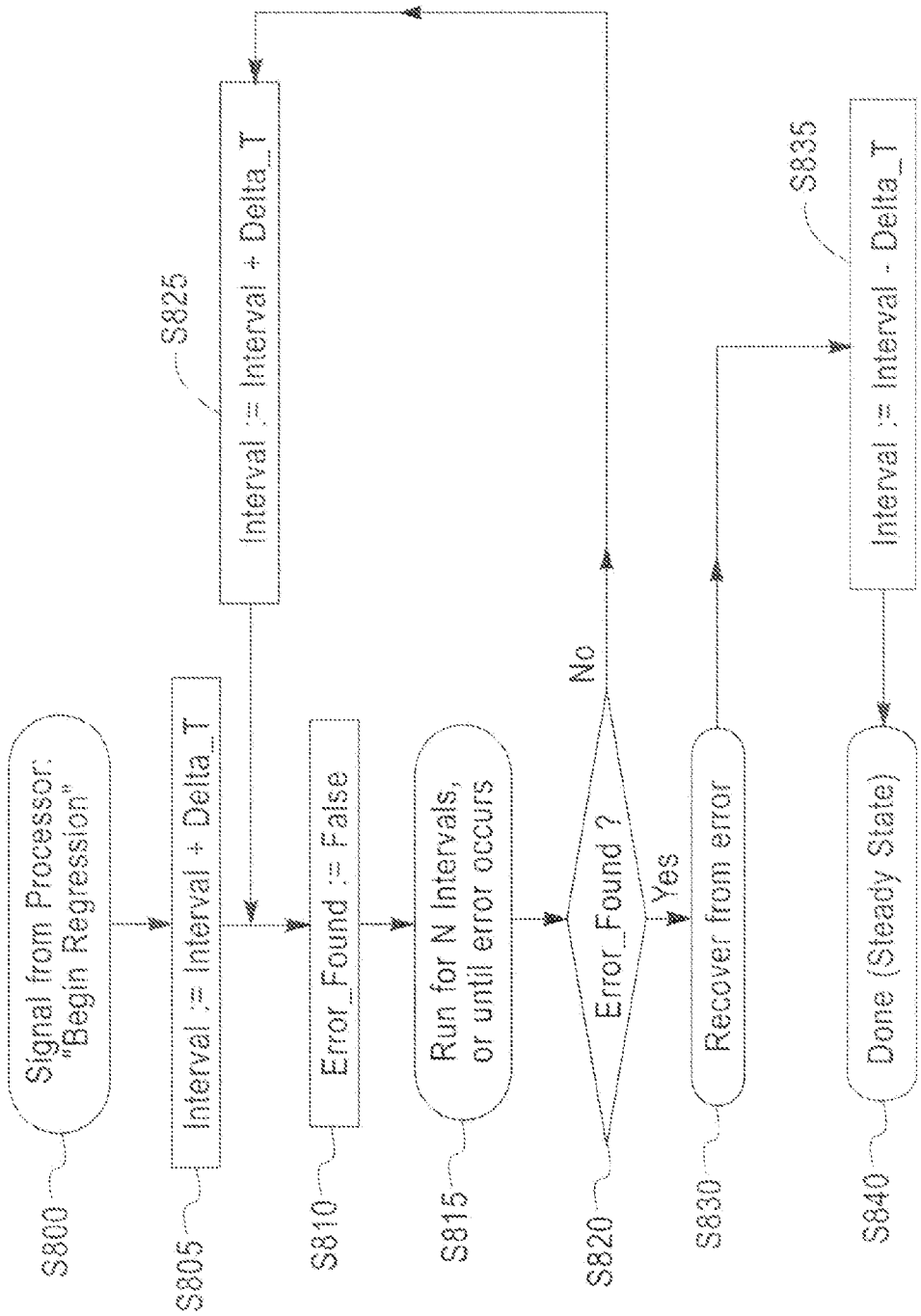
FIG. 8 illustrates a non-limiting example of an adaptation process according to one embodiment.

On the other hand, if the processor (or Service Processor) is able to sense the temperature, the processor "knows" when it has cooled, and when it is appropriate to attempt a regression. Similarly, the processor "knows" when it heats up and when it is appropriate to learn new refresh intervals. In FIG. 8, the processor may send a signal to the refresh hardware (or refresh software or combination thereof) to attempt a regression (S800). The Interval is increased by Delta_T (S805), and the error flag is turned off (S810). The process attempts to run for N intervals (S815). If no error is found (S820), the Interval is increased by Delta_T (S825), and the process continues lengthening the refresh Interval until an error occurs.

If an error is found (S820), the error is recovered from (S830), and the Interval is decreased by Delta_T (S835). Thus, Steady State has been learned (S840). This is a "reactive" adaptation process, because it is the known change in temperature that initiates the process. Incidentally, this may be viewed as a sub-process of the original adaptation processes of FIGS. 3 and 4.

Using Multiple Cache Partitions, Each with a Unique Refresh Interval

Exemplary embodiments have been described regarding how to delete problematic lines and to "learn" a single best refresh interval for the cache, which may be treated as a monolithic element. Further, exemplary embodiments have been described in which each congruence class operates with its own unique refresh interval, by partitioning of the cache and deleting problematic lines within each congruence class.

Figure 9:
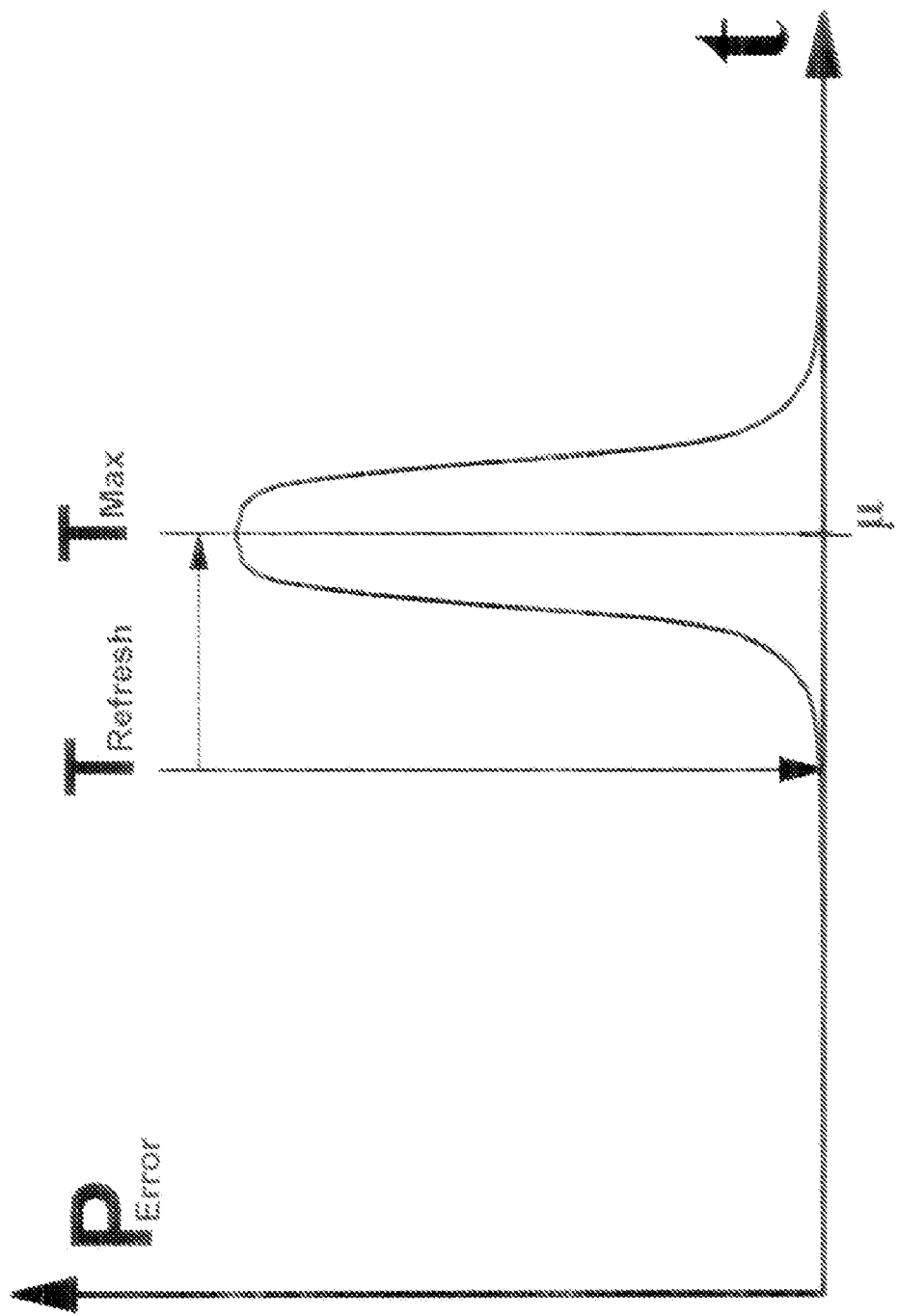
FIG. 9 illustrates a non-limiting example of a probability distribution function by congruence class.

FIG. 9 illustrates a probability distribution function of refresh intervals by congruence class to demonstrate the potential savings in average refresh interval obtainable by partitioning the cache. It has been described in this application how to "learn" where the point T_Refresh is, and this is where the cache operates, i.e., the refresh interval is limited by the "worst" congruence class (after performing deletions). If the process is run for each congruence class at its own unique learned refresh rate (as described in reference to FIG. 4), the cache has an average refresh interval of T_Max, as shown in FIG. 9. This provides the same value as further regressing the refresh interval to T_Max.

Figure 10:
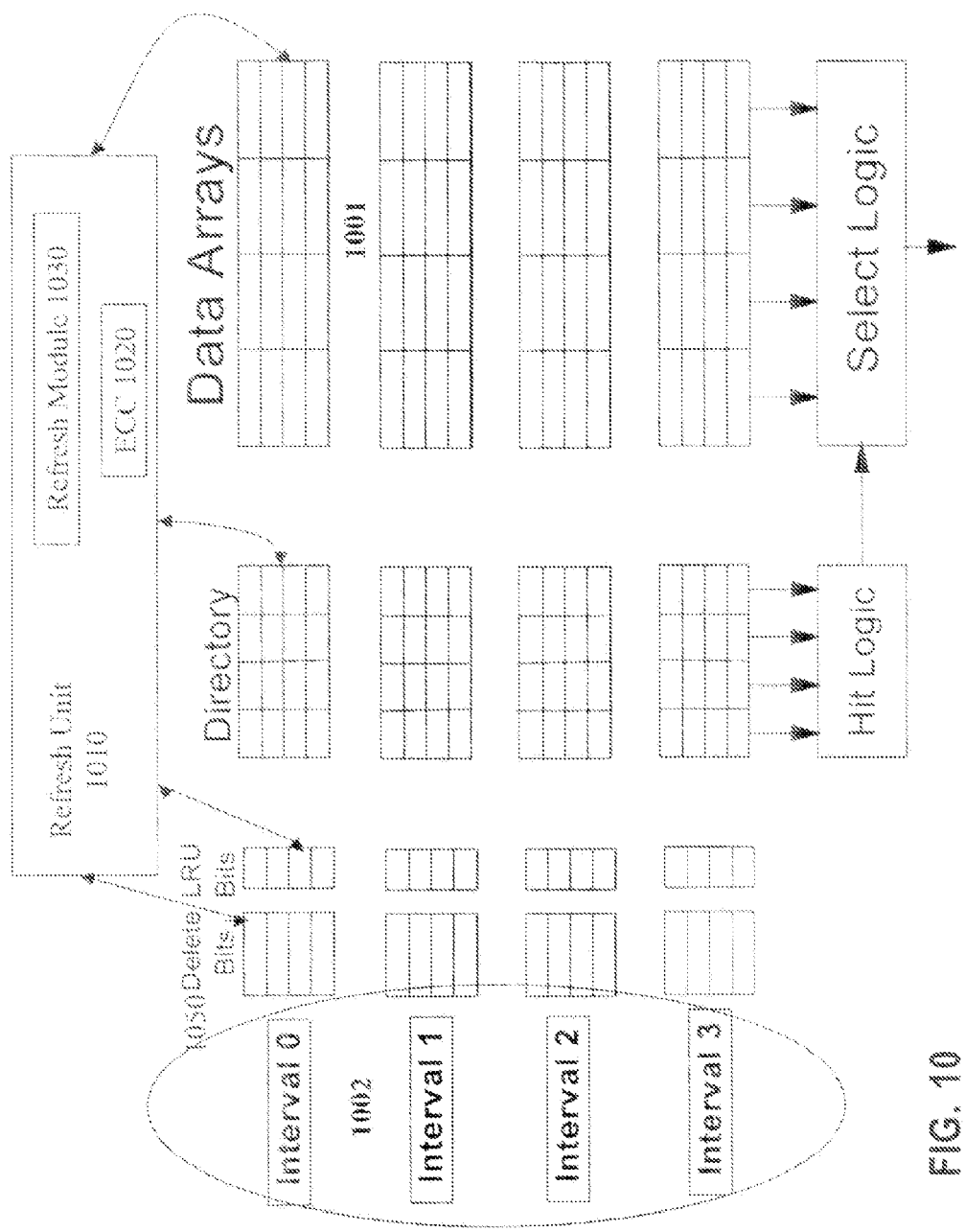
FIG. 10 illustrates a non-limiting example of a cache partitioned into four subcaches according to one embodiment.

FIG. 10 illustrates a non-limiting example of a cache partitioned into four subcaches with each subcache having its own refresh interval. Although FIG. 10 is a modified version of the cache of FIG. 1, physically, nothing about the cache has necessarily changed, except that the cache is envisioned as being partitioned into four subcaches (subsets). Each subset has a unique refresh interval (Intervals 0, 1, 2, and 3) 1002, which are learned for each quadrant of the cache in the manner disclosed herein. The average refresh interval for these four subcaches is longer than the refresh interval for the original cache. Therefore, more time may transpire before having to refresh the cache, and less power is consumed. The original cache (not partitioned into subcaches) has a refresh interval equal to the minimum of the refresh intervals 0, 1, 2, and 3.

Although no physical changes are required to the cache, to refresh quadrants of the cache independently, the structure of the data array 1001 (e.g., as a DRAM) must be amenable to having quadrants managed separately. That is, the physical structure of the data array 1001 portion of the cache must be structured in a way that allows the word lines in each quadrant to be independent. As a non-limiting example, the cache may be a set-associative cache.

Accordingly, the cache may be partitioned as finely as the individual congruence classes if desired, if the structuring of the data arrays 1001 permits it in a reasonable way. The cache is not limited to being partitioned as finely as an individual congruence class. Even though partitioning the cache requires space to store a refresh interval 0, 1, 2, and 3 for each congruence class 1002, having individual refresh intervals "learned" for each congruence class 1002 consequently results in an average refresh interval of T_Max, as shown in FIG. 10.

The refresh unit 1010 is configured to execute the adaptation (learning) processes described herein. The refresh unit 1010 may include Error Correcting Codes (ECC) module 1020 for determining and correcting errors in the cache line. The refresh unit 1010 may include a refresh module 1030 for executing the logical processes of the adaptation (learning) process. The refresh unit 1010 or the refresh module 1030 may be hardware, software, firmware, or any combination thereof.

In addition to determining the refresh interval for the cache (or each congruence class), the refresh unit 1010, via the refresh module 1030, dynamically manages the deletion of lines having errors, which includes determining the type of error and indicating whether the line should be deleted temporarily or permanently. Further, if the refresh unit 1010, via the refresh module 1030, determines that a deleted line should be reenlisted for service (as discussed herein), the refresh module 1030 brings the deleted line back into service so that writing and reading to that line is performed. Moreover, the Refresh Unit 1010 may be instructed to change parameters (e.g., MAX_PER_CC or MAX_DEL) of the adaptation process to meet desired performance requirements of the cache.

Further, the ECC module 1020 may be a stand along unit or it may be included in the refresh unit 1010.

The delete bits 1050 in FIG. 10 serve an identical function as the deletion state S603 in FIG. 6. The delete bits 1050 indicate whether or not a particular line has been deleted from the cache and, additionally, whether or not the deletion is intended to be permanent. The deletion of a line may be temporary if, for example, the error within the line was due to a retention type error or a soft error.

The remaining structures of FIG. 10 have been thoroughly described with reference to FIG. 1, and their descriptions are not repeated.

Additionally, lines that have been deleted for retention time failures or hard failures may be put back into to service by invoking any remaining on-chip redundancy to replace defective memory cells.

The capabilities of exemplary embodiments described above can be implemented in software, firmware, hardware or some combination thereof.

As one example, one or more features of the exemplary embodiments above can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow.

What is claimed is:

1. A method of operating a cache system comprising dynamic storage having an array of cells, the method comprising:

refreshing, at a refresh interval, the array of cells of the cache by reading the cache and writing back to the cache;

determining whether an error is found in the cache at the refresh interval;

if no error is found in the cache, repeatedly increasing the refresh interval by a predetermined amount until the error is found in the cache;

if the error is found in the cache, recovering from the error in the cache;

determining if a number of line deletions for the cache is a maximum number of line deletions for the cache;

if the maximum number of line deletions for the cache is not attained, deleting a line having the error from the cache and increasing the number of line deletions for the cache; and if the maximum number of line deletions for the cache is attained, decreasing the refresh interval for refreshing by the predetermined amount.

2. The method of claim 1, further comprising:

partitioning the array of cells of the cache into a plurality of subsets; and individually determining the refresh interval for each subset of the plurality of subsets.

3. The method of claim 2, wherein the operation of individually determining the refresh interval for each subset of the plurality of subsets comprises:

refreshing, at the refresh interval, each subset of the plurality of subsets in the cache;

determining whether an error is found in each subset of the plurality of subsets at the refresh interval;

if no error is found in respective subsets of the plurality of subsets, repeatedly increasing the refresh intervals for respective subsets of the plurality of subsets by a predetermined amount until the error is found;

if the error is found in respective subsets of the plurality of subsets, recovering from the error in each respective subset of the plurality of subsets;

if the error is found in respective subsets of the plurality of subsets, determining if a number of line deletions for each respective subset of the plurality of subsets is one of:

a maximum number of line deletions for respective subsets of the plurality of subsets, and a maximum number of line deletions for the cache;

if the maximum number of line deletions for the cache is not attained and if the maximum number of line deletions for respective subsets of the plurality of subsets is not attained, deleting a line having the error from respective subsets of the plurality of subsets and increasing the number of line deletions for respective subsets of the plurality of subsets;

if the maximum number of line deletions for respective subsets of the plurality of subsets is attained but the maximum number of line deletions for the cache is not attained, decreasing the refresh interval by the predetermined amount for the respective subsets of the plurality of subsets; and if the maximum number of line deletions for the cache is attained, decreasing the refresh interval for the respective subsets of the plurality of subsets by the predetermined amount.

4. The method of claim 1, further comprising:

determining the type of error found in the cache.

5. The method of claim 4, wherein the operation of determining the type of error in the cache comprises:

writing all ones "1" to the cache and reading the cache, wherein if the error is found, the error is a hard error;

writing all zeros "0" to the cache and reading the cache, wherein if the error is found, the error is the hard error; and writing all ones "1" to the cache, waiting the refresh interval for refreshing, and reading the cache, wherein:

if no error is found, the error is a soft error, and if the error is found, the error is a retention error.

6. The method of claim 5, further comprising:

if the error is the hard error, permanently deleting the line having the hard error and storing a deletion state of the permanently deleted line in a nonvolatile memory;

if the error is the retention error, temporarily deleting the line having the retention error and storing a deletion state of the temporarily deleted line in the nonvolatile memory; and if the error is the soft error, continuing to use the line that had the soft error.

7. The method of claim 3, wherein the maximum number of line deletions for the cache is set in advance, and the maximum number of line deletions for each respective subset of the plurality of subsets is set in advance.

8. The method of claim 1, further comprising:

replacing the line having the error in the cache with a line in a higher level cache, such that writing and reading is to the line in the higher level cache and not the line having the error in the cache.

9. The method of claim 3, further comprising:

respectively forming the plurality of subsets in accordance with a plurality of congruence classes of the cache, wherein each congruence class comprises a plurality of cache lines in which writing and reading of data occur.

10. The method of claim 1, further comprising:

continuing to increase the refresh interval by the predetermined amount and continuing to delete the line having the error, until the number of line deletions for the cache equals the maximum number of line deletions for the cache, wherein continuing to increase the refresh interval by the predetermined amount for refreshing the cache generates the error.

11. The method of claim 1, wherein deleting the line comprises precluding writing and reading to at least one of a row, a cache line, a cache block and a multi-bit word.

12. The method of claim 1, further comprising:

re-learning the refresh interval if a temperature of the cache increases or decreases.

13. The method of claim 1, further comprising:

if the refresh interval of the cache is decreased such that the rate of refresh accommodates a refresh interval of a deleted line, bringing the deleted line back into service such that writing and reading is to the deleted line.

14. A cache system comprising:

a dynamic storage device comprising an array of memory cells arranged in rows and columns;

an error correction unit for determining and correcting an error found in the array of memory cells of the dynamic storage device; and a refresh unit configured to manipulate a refresh interval of the array of memory cells in the dynamic storage device;

wherein if no error is found, the refresh unit is configured to increase the refresh interval by a predetermined amount until the error is found in the dynamic storage device;

wherein if the error is found, the error correction unit is configured to correct the error in the dynamic storage device; and wherein if the error is found, the refresh unit is configured to delete a line having the error until a number of line deletions for the dynamic storage device is a maximum number of line deletions for the dynamic storage device, and the refresh unit is configured to reduce the refresh interval by the predetermined amount.

15. The cache system of claim 14, wherein:

the array of memory cells is partitioned into a plurality of subsets, each subset having a respective refresh interval;

the refresh unit is configured to determine and to control, individually, the refresh interval for each subset of the plurality of subsets, wherein the refresh unit increases the refresh interval by the predetermined amount for each subset until the error is found;

if the error is found in respective subsets of the plurality of subsets, the error correction unit is configured to correct the error and, the refresh unit is configured to determine if a number of line deletions for each subset of the plurality subsets is one of:

a maximum number of line deletions for respective subsets of the plurality of subsets, and the maximum number of line deletions for the dynamic storage device;

if the maximum number of line deletions for the dynamic storage device is not attained and if the maximum number of line deletions for respective subsets of the plurality of subsets is not attained, the refresh unit is configured to delete a line having the error from respective subsets of the plurality of subsets and increase the number of line deletions for respective subsets of the plurality of subsets;

if the maximum number of line deletions for respective subsets of the plurality of subsets is attained but the maximum number of line deletions for the dynamic storage device is not attained, the refresh unit is configured to decrease the refresh interval by the predetermined amount for respective subsets of the plurality of subsets; and if the maximum number of line deletions for the dynamic storage device is attained, the refresh unit is configured to decrease the refresh interval for respective subsets of the plurality of subsets by the predetermined amount.

16. The cache system of claim 14, further comprising:

a nonvolatile memory for storing the refresh history and the deletion history of the array of memory cells in the dynamic storage device.

17. A refresh unit for controlling operations of an array of memory cells, comprising:

a refresh interval module configured to manipulate the refresh interval of the array of memory cells; and an error correction module;

wherein the refresh interval module repeatedly increases the refresh interval by a predetermined amount until an error is found and the error correction module corrects the error, if the error is found and if a number of line deletions of the array is not a maximum number of line deletions of the array, the refresh interval module is configured to:

delete a line having the error;

increase the refresh interval by the predetermined amount; and increase the number of line deletions of the array;

wherein if the error is found and if the number of line deletions of the array is the maximum number of line deletions of the array, the error correction module corrects the error and the refresh interval module reduces the refresh interval by the predetermined amount.

18. The refresh unit of claim 14, wherein the refresh interval module is configured to control the array of memory cells as a plurality of subsets, each subset having a respective refresh interval.

19. The refresh unit of claim 15, wherein:

the refresh interval module increases the refresh interval by the predetermined amount for each subset of the plurality of subsets until the error is found;

if the error is found in respective subsets of the plurality of subsets, the error correction module is configured to correct the error and the refresh interval module is configured to determine if a number of line deletions for each subset of the plurality subsets is one of:

a maximum number of line deletions for respective subsets of the plurality of subsets, and the maximum number of line deletions for the array;

if the maximum number of line deletions for the array is not attained and if the maximum number of line deletions for respective subsets of the plurality of subsets is not attained, the refresh interval module is configured to delete a line having the error from respective subsets of the plurality of subsets and increase the number of line deletions for respective subsets of the plurality of subsets;

if the maximum number of line deletions for respective subsets of the plurality of subsets is attained but the maximum number of line deletions for the array is not attained, the refresh interval module is configured to decrease the refresh interval by the predetermined amount for respective subsets of the plurality of subsets; and if the maximum number of line deletions for the array is attained, the refresh interval module is configured to decrease the refresh interval for respective subsets of the plurality of subsets by the predetermined amount.

* * * * *